United States Patent
Szajnowski (10) Patent No.: US 7,515,089 B2
(45) Date of Patent: Apr. 7, 2009

(54) SIGNAL ANALYSIS

(75) Inventor: Wieslaw Jerzy Szajnowski, Guildford (GB)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 917 days.

(21) Appl. No.: 10/974,857

(22) Filed: Oct. 28, 2004

(65) Prior Publication Data
US 2005/0122256 A1 Jun. 9, 2005

(30) Foreign Application Priority Data
Oct. 31, 2003 (EP) ................................. 03256922

(51) Int. Cl.
*G01S 13/04* (2006.01)
*G04F 10/06* (2006.01)

(52) U.S. Cl. ........................................ 342/27; 342/175

(58) Field of Classification Search .................... 342/27, 342/175
See application file for complete search history.

(56) References Cited

U.S. PATENT DOCUMENTS

2005/0122256 A1* 6/2005 Szajnowski ................. 342/175

FOREIGN PATENT DOCUMENTS

| DE | 198 27 514 A1 | 12/1999 |
|---|---|---|
| EP | 1 378 854 A1 | 1/2004 |
| EP | 1528408 A 1 * | 5/2005 |
| WO | WO-00/39643 A1 | 7/2000 |
| WO | WO-02/059642 A2 | 8/2002 |
| WO | WO-03/036564 A1 | 5/2003 |

OTHER PUBLICATIONS

Berndt, IEEE Transactions on Information Theory, vol. 14, No. 6 (1968) pp. 796-801.
Liu et al., IEEE Transactions on Aerospace and Electronic Systems, vol. 39, No. 2 (2003) pp. 489-498.

* cited by examiner

*Primary Examiner*—Dan Pihulic
(74) *Attorney, Agent, or Firm*—Birch, Stewart, Kolasch & Birch, LLP (57) ABSTRACT

A wideband irregular signal is decomposed into respective frequency bands, the ratio of the highest to the lowest frequency within each band being in the ratio of approximately 3:1 and the total number of bands being 3 or 4. The wideband signal, or a re-constituted wideband signal formed by combining the decomposed components, is transmitted as a interrogating signal. A reflection of the interrogation signal is decomposed into respective frequency bands, and within each frequency bands the different components are compared. The results of the comparisons are combined to determine whether an object has been detected and, if so, its range. Decomposition of the wideband signal can be achieved by using a bank of low-pass filters in respective frequency bands, the output of each low-pass filter having subtracted there from the output from the filter with the next-lower frequency cutoff characteristic. Delay circuits are used within each channel so that the total delays in each individual channel are equal.

16 Claims, 10 Drawing Sheets

PRIOR ART

SIGNAL ANALYSIS

FIELD OF THE INVENTION

This invention relates to a method and apparatus for decomposing and representing a wideband irregular signal by a plurality of component random signals, each component signal occupying a frequency band narrower than that of the primary signal. The invention is particularly useful for improving the analysis, representation and/or processing of signals using techniques involving the detection of level-crossings, such as zero-crossings.

BACKGROUND OF THE INVENTION

There are a number of signal analysis techniques which involve detecting level-crossings, and particularly zero-crossings. For example, polarity coincidence correlation is a technique which has been well-known for a long time (see, for example, Helmut Berndt, "Correlation Function Estimation by a Polarity Method Using Stochastic Reference Signals". IEEE Transactions on Information Theory, vol. 14, No. 6, Nov. 1968, pp. 796-801).

Figure 1:
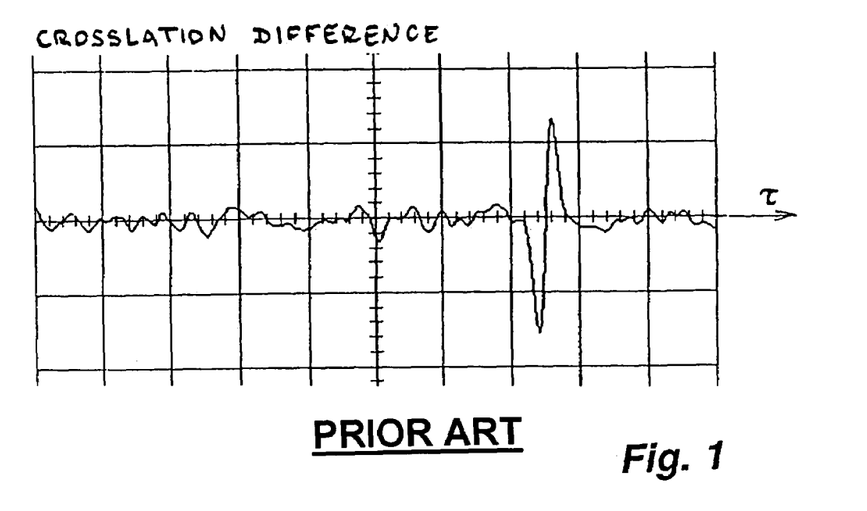
FIG. 1 shows an example of an S-shaped function obtained experimentally by processing a wideband noise signal.

A more recent example is disclosed in WO-A-00/39643 (incorporated herein by reference). This describes a method of detecting the shift between two irregular signals, one of which is a copy of the other, by detecting non-uniformly spaced zero-crossings in a first signal, and using these to trigger the sampling of the second signal. The system introduces different delays between the zero-crossings and the sampling time. For each respective delay value, the samples are summed. For most delays, the summed samples will represent an average signal value. However, when the delay is close to a value which matches the shift between the signals, the summed samples become coherent, giving rise to a distinctive feature in the system output. FIG. 1 shows a typical output, with the horizontal axis representing the introduced delay between the detected zero-crossing and the sampling of the second signal. The S-shaped odd function clearly shown therein is located at a position corresponding to the time shift between the two signals.

This method will be referred to as "crosslation", and a system implementing the method will be referred to as a "crosslator". Such techniques can be used for object detection, for example by transmitting a wideband, noise-like irregular signal, and measuring the delay between that signal and a reflection of the signal from an object.

As explained in WO-A-00/39643, the detected zero-crossings may be those which occur when the signal level crosses zero with a positive slope (upcrossings), those which occur when the level crosses zero with a negative slope (downcrossings), or both. If both upcrossings and downcrossings are used, the summed samples defined by upcrossings are subtracted from those defined by downcrossings.

Figure 2:
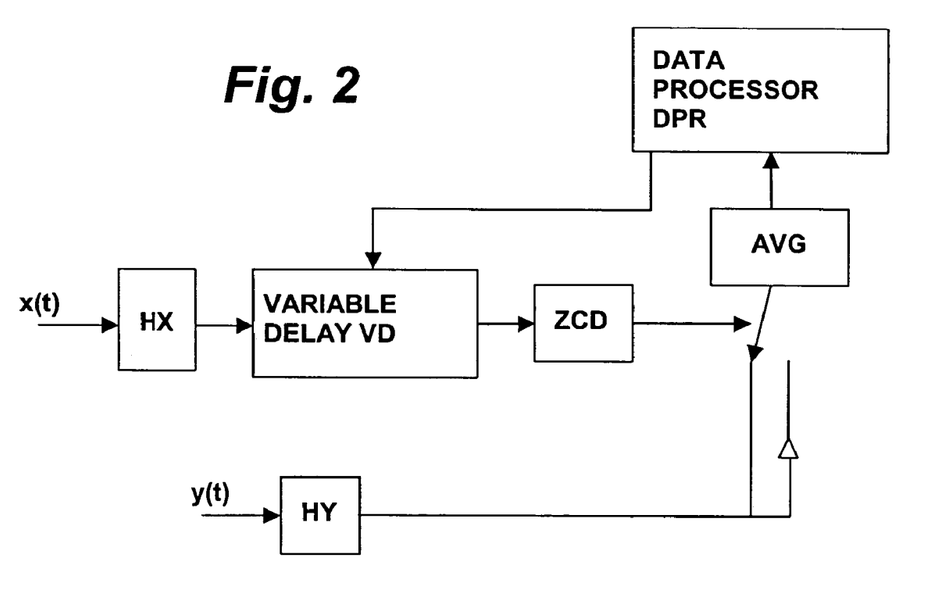
FIG. 2 is a block diagram of a time delay determining system using serial crosslation techniques.

In WO-A-00/39643, a shift register produces multiple versions of the second signal, the versions being delayed by different amounts. Each zero-crossing simultaneously triggers the sampling of these different versions. FIG. 2 shows another form of crosslator for measuring time delay in an object detection and ranging system. In the FIG. 2 system, the values derived by combining the samples of the second signal are obtained in succession for respective different delays, rather than simultaneously. In FIG. 2, the second signal y(t) is converted by a hard limiter HY into a corresponding binary bipolar waveform. This waveform and its polarity-reversed replica are supplied to an averaging or integrating unit AVG via a switch. The switch is normally open but supplies the output or its polarity-reversed replica to unit AVG when a zero-crossing detector ZCD detects, respectively, an upcrossing or a downcrossing in the first signal x(t). The signal x(t) has been processed by a hard limiter HX and then delayed by a variable delay line VD. After a predetermined time interval has elapsed (or when a predetermined condition is met, such as the number of zero-crossings reaching a predetermined value), the output of unit AVG is delivered to a data processor DPR. This output will represent one point on the function illustrated in FIG. 1. The data processor DPR sets the delay introduced by the variable delay line VD to a different value, and then repeats the operation, to derive a further point on the function. By comparing the different values obtained from the unit AVG for different delays, the data processor DPR can determine the delay between the signals x(t) and y(t). The variable delay line VD could instead be placed in the path of the signal y(t), the signal x(t) being subjected to a suitable constant delay. In another modification, the hard limiter HY is omitted and the unit AVG operates directly on the analog values of the signal y(t). Furthermore, a monitoring system can be obtained by using a fixed delay in place of the variable delay line VD, whereby the system can be used to monitor whether the range of an object departs from a particular distance corresponding to the value of that fixed delay.

The shift between the two signals may represent time, as in the object detection and ranging system mentioned above, or may represent another parameter, such as linear or angular shift. In one specific example, a first signal may represent an image, for example a line through a two-dimensional video image. A second signal may represent a second version of the image, which is linearly shifted (translated) with respect to the first. Each signal could for example be a grey scale representation of a line across a video screen. One of the signals can be processed so as to obtain successive points each representing the intersection of the grey scale waveform with a particular reference level. These points can then be used for the sampling of different versions of the second signal, each version being associated with a different linear shift. The amount of image movement can thus be determined by using the crosslation technique mentioned above.

Another example of signal analysis which involves the use of zero-crossing detection is shown in EP-A-1378854 (incorporated herein by reference). Here a crosslation technique is used to derive information about a signal, for example to classify images or sounds or other physical phenomena represented by the signal. In this case, the zero-crossings detected in the signal are used to trigger the sampling of the same signal. A delay is introduced between the occurrence of each zero-crossing and the sampling of the signal. The samples are combined to get a first value. The operation is repeated with different delays to produce other values. The multiple values derived using the different delays form a representation of the original signal, and the shape of this representation indicates a statistical characteristic of the signal.

A further technique involving level-crossing detection is disclosed in WO-A-03/036564 (incorporated herein by reference). An image is analysed by using a mapping function to derive a one-dimensional representation of the image, the representation having a varying level, and by determining (a) the rate at which the level crosses one or more thresholds, (b) the average slope of the signal when it crosses one or more threshold levels, and/or (c) the average duration for which the signal remains above one or more threshold levels.

The performance of the systems mentioned above is impaired by noise and other interfering signals. Because unwanted signals are not related functionally or statistically to the irregular signal being processed, the efficacy of interference suppression will increase with the number of level-crossings in the signal. Taking the crosslation technique of WO-A-00/39643 as an example, the number of averaged segments of a received signal y(t) is determined by the number of significant events (zero-crossings) extracted from a transmitted random signal x(t). Therefore, it would be desirable to determine an optimum number of signal segments of y(t) which need to be averaged in time T to provide maximum interference suppression.

It is known, by the sampling theorem, that a wideband random signal is completely determined by its samples taken uniformly at time instants separated by the interval 1/(2W), where W is the highest frequency component of the signal's power spectrum. This result is often stated that a noise waveform of duration T contains $\Lambda=2WT$ degrees of freedom.

In signal processing applications, the product $\Lambda$ is also referred to as the processing gain, because it indicates the bound on the achievable reduction of noise power by averaging uncorrelated samples of a respective noise waveform. It is also known that the above results apply to cases when a noise waveform is sampled in a non-uniform manner, yet with the mean sampling rate of 2W samples per second.

From the above discussion it follows that the ability of a processor operating on zero-crossings to suppress unwanted interference can be degraded when the number of zero-crossings extracted from a transmitted wideband signal x(t) is less than $\Lambda$. This conclusion will be explained in more detail by way of the following example.

EXAMPLE 1

Assume that a received signal y(t) contains an interfering signal n(t) with a uniform power spectral density, band-limited to the frequency range (0, W); hence, the number of degrees of freedom in time T is $\Lambda=2WT$. Consequently, by averaging, it is possible to reduce the interfering signal power by a factor of $\Lambda$.

Suppose also that a zero-mean Gaussian random signal x(t), used for surveillance purposes, has a uniform power spectral density band-limited to (0, W). From Rice's formula, it follows that the expected number of all zero-crossings contained in x(t) in time T is equal to $N_0(T)=2TB_x$, where $B_x=W/\sqrt{3}$ is the root-mean-square (rms) bandwidth of x(t); hence, $N_0(T)=2WT/\sqrt{3}<\Lambda$. Because each zero-crossing determines exactly one segment of a received signal y(t) to be averaged, the power of the interfering signal n(t) will be reduced by only a fraction, $1/\sqrt{3}\approx 0.58$, of the maximum achievable value $\Lambda$.

Accordingly, the crosslation-based techniques disclosed in WO-A-00/39643 cannot provide optimum-efficiency suppression of interference, because the number of zero-crossings extracted from a transmitted random signal x(t) is, in general, less that the number of degrees of freedom contained in an unwanted interfering signal n(t).

Accordingly, it would be desirable to provide a technique for enabling improved range resolution and interference suppression. The resulting improved technique may, for example, be employed in a surveillance system operating in a radio or microwave frequency range and utilizing a wideband random signal for object detection and localisation.

By analogy, the other signal processing applications described above which rely on level-crossings have non-optimum performance, and it would be further desirable to improve this performance.

DESCRIPTION OF THE INVENTION

Aspects of the present invention are set out in the accompanying claims.

According to a further and independent aspect of the invention, a wideband irregular analog signal is decomposed into channels occupying different frequency bands (with preferably at least substantially equal relative bandwidths) in such a way that the signals in the channels collectively exhibit significantly more crossings of a given level (e.g. zero) than the original wideband signal.

As shown in: I. J. Good, The Loss of Information due to Clipping a Waveform, *Information and Control.* 10, 220-222 (1967), the contents of which are incorporated herein by reference, zero-crossings of a noise waveform can provide a sufficient number of degrees of freedom, when the power spectral density of noise is uniform in the frequency band $(W_1, W_2)$, vanishes outside that band, and $W_1$ is no less than $$W_{1min} = \frac{4W_2}{7+\sqrt{33}} \approx 0.3139 W_2 \qquad 1$$

Therefore, when $W_1 < W_{1min}$, the power of the interfering component n(t) present in the received signal y(t) will be reduced by less than the maximum achievable value of the processing gain $\Lambda=2(W_2-W_1)T$.

Accordingly, it is desirable for the ratio of the highest frequency to the lowest frequency within each frequency band to be approximately 1/0.3139:1, i.e. approximately 3.19:1. This figure varies for non-uniform (e.g. Gaussian) spectral densities, but nevertheless for a signal of practical value will be approximately 3:1 or slightly greater. In the present invention, generally it is preferable for this ratio to be in the range of 2.5:1 to 3.5:1 to allow for optimum, or near-optimum, efficiency. A smaller ratio will result in the need for a greater number of channels, leading to redundancy and inefficiency (although in certain circumstances the redundancy may be desirable). A larger ratio will result in fewer zero-crossings and thus significantly reduced efficiency.

The frequency bands are preferably at least approximately contiguous. Accordingly, the ratio ranges mentioned above apply also to the ratio of, e.g., the highest frequency of each band to the highest frequency of the next lower band. The highest and lowest frequencies of each band may be defined by any well-known bandwidth definition, such as rms bandwidth or 3 db bandwidth; indeed, usually the precise definition is not relevant when considering frequency ratios, as this is merely a matter of scaling.

Preferably the frequency bands collectively cover substantially the entire spectrum of the wideband signal; however the invention does not exclude the possibility of small frequency ranges within this spectrum being omitted. The invention is particularly applicable to low-pass wideband signals which have a power spectrum extending to d.c. (a frequency of 0 Hz). In this case the lowest frequency band may be defined by a low-pass filter. Accordingly, the above-mentioned upper limit for the highest/lowest frequency ratio may not apply to the lowest frequency band.

According to a further independent aspect of the present invention, a primary wideband irregular signal x(t) is decomposed into a number M of component irregular signals, $x_1(t)$, $x_2(t), \ldots, x_M(t)$, in such a manner that:

each component signal will occupy a frequency band narrower than that of the primary signal;
  the component signals will collectively provide a substantially increased number of zero-crossings, preferably no less than the number of degrees of freedom contained in the primary wideband irregular signal x(t);
  the component signals will collectively provide a number of zero-crossings no less than the number of degrees of freedom contained in an unwanted interfering signal to be suppressed;
  the component signals can be suitably combined to reconstitute the primary wideband irregular signal x(t).

The invention extends to methods and apparatus for decomposing wideband signals, to methods and apparatus for the investigation of signals, or pairs of signals, using such decomposition techniques, and to methods and apparatus for object detection and/or ranging using such investigation techniques.

DESCRIPTION OF THE DRAWINGS

Arrangements embodying the invention will be described by way of example with reference to the accompanying drawings.

DETAILED DESCRIPTION OF A PREFERRED EMBODIMENT

Figure 3:
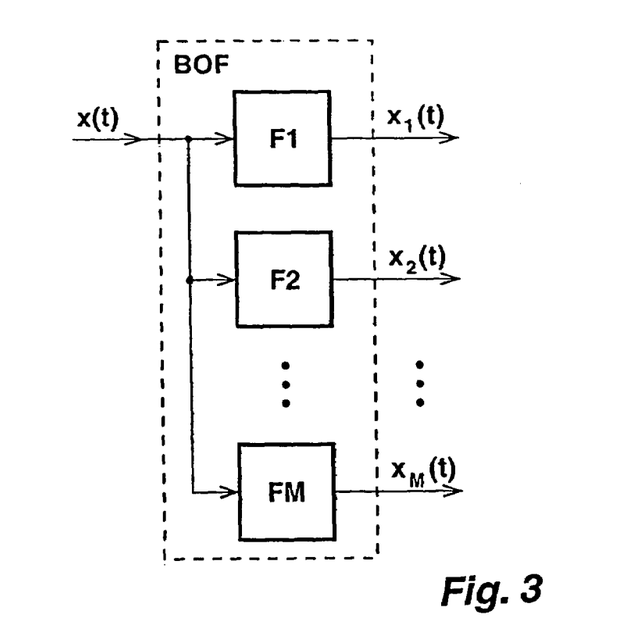
FIG. 3 depicts a block diagram of a bank of filters performing decomposition of a primary wideband random signal, according to the invention.

FIG. 3 depicts a block diagram of a bank of filters BOF performing decomposition of a primary wideband analog signal x(t) according to the invention. The bank BOF comprises a plurality of bandpass filters, F1, F2, ..., FM, sharing a common input driven by a primary wideband signal x(t) to be decomposed. Each filter Fm, m =1, 2, ..., M, of the bank BOF has a rectangular power transfer function $|H_m(f)|^2$, and the filters jointly and contiguously cover the frequency band ($W_1, W_2$) occupied by the input signal x(t). By construction, when the transfer function $H_m(f)$ (or, equivalently, the impulse response) of each filter of the bank BOF has been specified, the resulting component random signals, $x_1(t)$, $x_2(t), \ldots, x_M(t)$, will represent jointly the input wideband random signal x(t) in a unique way. It should be also noted that the component random signals are mutually independent, because their power spectra do not overlap.

When the power spectral density of a component random signal $x_m(t)$ is uniform, the number of zero-crossings occurring in that signal (observed at the output of filter Fm) will be equal to (or greater than) the number of degrees of freedom contained in that signal, if the ratio of the upper cut-off frequency to the lower cut-off frequency for filter Fm, is equal to (or less than) $1/0.3139 \approx 3.19$ (as shown in Example 1).

When the power spectral density of a primary wideband random signal x(t) to be decomposed is uniform in the frequency band ($W_1, W_2$) and vanishes outside that band, the required number M of filters used by the bank BOF will depend on the ratio $R_{UL} = W_2/W_1$, as shown in Table 1 below.

TABLE 1

| $R_{UL}$ | M |
|---|---|
| $R_{UL} \leq 3.19$ | 1 |
| $3.19 < R_{UL} \leq 10.15$ | 2 |
| $10.15 < R_{UL} \leq 32.33$ | 3 |

Figure 4:
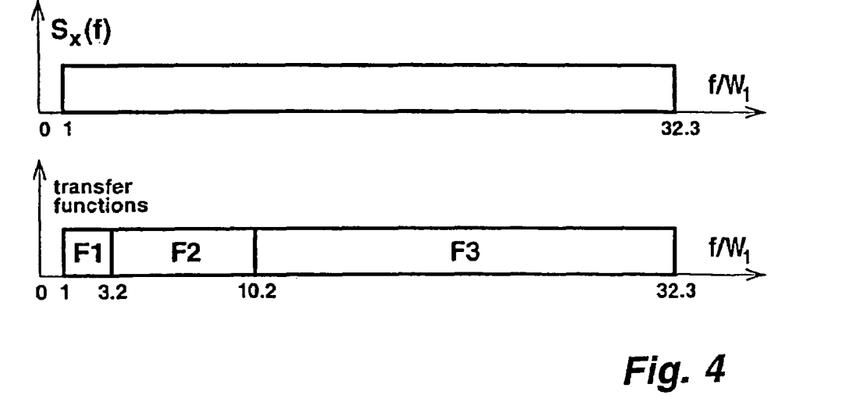
FIG. 4 shows a relationship between the rectangular spectrum of a primary wideband random signal and the rectangular power transfer functions of the three bandpass filters used for signal decomposition, according to the invention.

In practical applications, the value of the ratio $R_{UL}$ will rarely exceed 32. For example, in order to detect various complex objects, an interrogating signal will have to contain frequency components ranging from 30 MHz to 960 MHz (hence, $R_{UL}$=32), as stated in: Guo-Sui Liu et al., Random Signal Radar, *IEEE Transactions on Aerospace and Electronic Systems.* 39, 489-498 (April 2003), For illustrative purposes, FIG. 4 shows schematically the relationship between the rectangular spectrum $S_x(f)$ of a primary wideband signal x(t) and the power transfer functions of three bandpass filters, F1, F2 and F3 used for signal decomposition. It should be noted that a first component signal $x_3(t)$ contains about 67% of the total power of the primary signal x(t).

When a primary wideband random signal x(t) is strictly a low-pass signal (i.e. its power spectral density extends to zero, hence $W_1$=0), the number M of required bandpass filters will theoretically tend to infinity, and the bank of filters BOF will adopt a 'fractal' structure. However, in practice, the M-th filter of the bank BOF can be replaced by a low-pass filter. In such a case, when only three filters (M=3) are used, the loss in the number of degrees of freedom will be less than 4.2%, and for four filters (M=4), this loss reduces further to about 1.3%. Therefore, in most practical applications, the number M of bandpass filters employed by the bank BOF for signal decomposition will be limited to three or four, irrespective of the spectral width of a wideband random signal x(t) to be decomposed. There may be some arrangements in which two filters would be sufficient, for example in a surveillance system using the 50 MHz to 600 MHz foliage penetration band.

Figure 5:
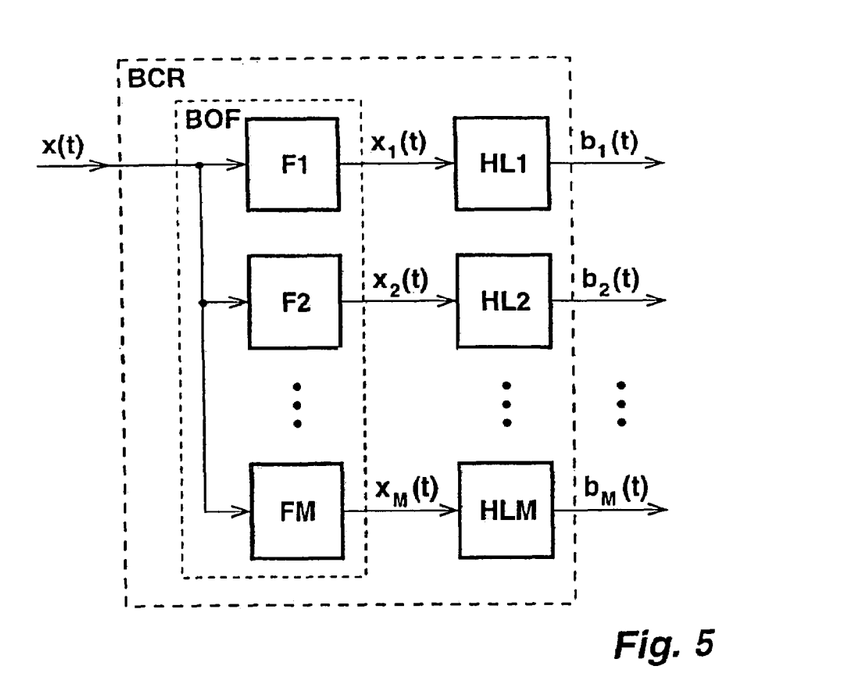
FIG. 5 shows an M-channel binary component resolver arranged to operate according to the invention.

According to a preferred aspect of the invention, each bandpass filter Fm of the bank BOF is followed by a respective hard limiter HLm to form an M-channel binary component resolver BCR whose block diagram is depicted in FIG. 5. As a result, each component random signal $x_m(t)$ is converted into a corresponding random binary waveform $b_m(t)$, and a primary wideband random signal x(t) is represented collectively by M random binary waveforms, $b_1(t), b_2(t), \ldots, b_M(t)$. From mutual independence of component random signals it follows that the resulting random binary waveforms are also mutually independent. It is to be noted that the hard limiters do not necessarily produce equal and constant-level outputs; each output may have an amplitude dependent on, for example, the power of the respective signal component.

Figure 6:
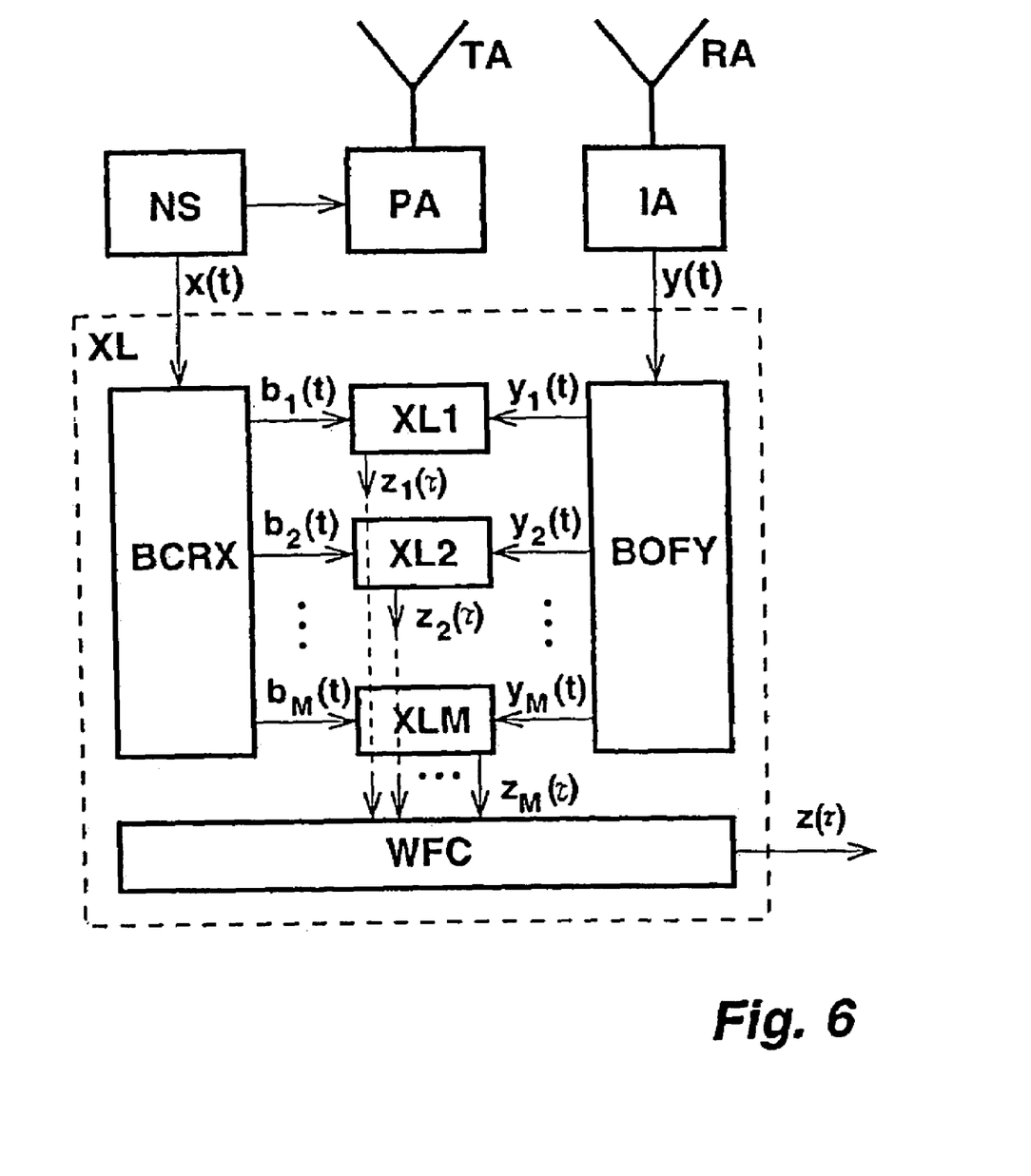
FIG. 6 is a block diagram of an object detection and ranging system arranged to operate in accordance with the present invention.

An M-channel binary component resolver and a bank of filters, arranged in accordance with the present invention, can be used to construct an improved crosslator XL to be employed as a signal processor SP for an object sensing device. A block diagram of a resulting system is depicted in FIG. 6. The system comprises a wideband noise source NS with a flat spectrum, a power amplifier PA, a transmit antenna TA, a receive antenna RA, an input amplifier IA, an M-channel binary component resolver BCRX having the structure shown in FIG. 5, a bank of M filters BOFY having the structure shown in FIG. 3, M signal processors, XL1, XL2, ..., XLM, and a waveform combiner WFC. Each of the signal processors, or crosslators, XL1, XL2, ..., XLM may have a structure corresponding to that shown in any one of FIGS. 9, 11 and 13 of WO-A-00/39643.

A copy of a wideband random transmitted signal x(t) with a flat spectrum is decomposed by the binary component resolver BCRX into M respective random binary waveforms, $b_1(t), b_2(t)$ and $b_M(t)$. Each processor XLm, m=1, 2, ..., M, (i) extracts zero-crossings from a respective binary waveform $b_m(t)$, (ii) uses these zero-crossings to define respective segments of a corresponding received component signal $y_m(t)$ supplied by filter Fm of the bank BOFY, and (iii) averages those defined segments. As a result, each processor XLm produces a partial response $z_m(\tau)$ containing information about the reflectivity and locations of various scatterers present in the region examined by the sensing system. When only a single reflecting object is present in the region, each partial response $z_m(\tau)$ will assume the form of an S-shaped curve, similar to that shown in FIG. 1.

All the partial responses are then suitably combined in the waveform combiner WFC to provide a global response $z(\tau)$, which will be similar to the partial response $z_m(\tau)$, but will be significantly less influenced by noise. If desired, the partial responses may be combined in a weighted manner, the weighting being dependent on, for example, the powers of the signals in the respective frequency bands.

In some specific applications, the system can be modified by replacing the bank of filters BOFY by a suitable M-channel binary component resolver.

The system shown in FIG. 6 involves copying the transmitted signal to the binary component resolver BCRX. In an alternative system shown in FIG. 7, a noise signal s(t) is delivered to the binary component resolver BCRX, which not only splits the signal into components occupying different frequency bands, but also generates an interrogation signal x(t) which corresponds to a combination of those components. (Techniques for achieving this will be described below with reference to FIGS. 12 and 13.) Accordingly, the decomposed received signal will more closely match the decomposed version of the transmitted signal.

Figure 7:
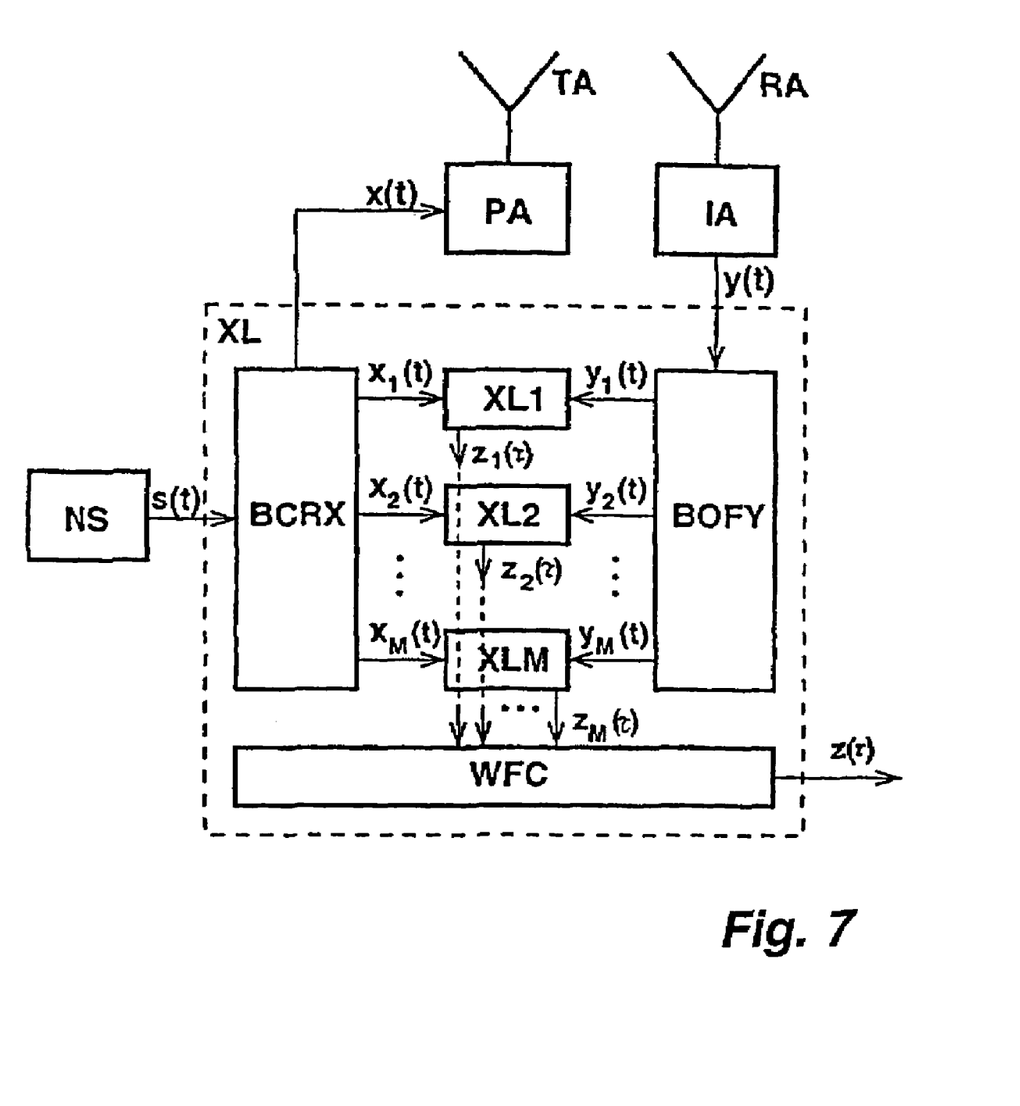
FIG. 7 is a block diagram of another object detection and ranging system arranged to operate in accordance with the present invention.

The arrangements of FIGS. 6 and 7 generate an interrogation signal x(t) and then transmit it via a single channel (including the transmit antenna TA and receive antenna RA). As an alternative, the separate components $x_1(t), x_2(t), \ldots$ could be transmitted via respective different channels, e.g. one for each component. The single interrogation signal x(t) may thus be created by the simultaneous presence of the components transmitted via respective separate transmit antennas. Additionally, or alternatively, the single receiving antenna could be replaced by a plurality of antennas for receiving different frequency bands. These alternatives are particularly useful where it is difficult or expensive to make a wideband antenna of suitable characteristics, but could also be useful in other circumstances, e.g. when transmitting via other media such as optical fibre.

The basic bank of filters with rectangular responses is of limited practical application for two reasons:

the frequency spectrum of a wideband random signal x(t) suitable for ranging purposes will have a shape substantially different from a rectangular one; the spectrum will decay monotonically and rather slowly (not abruptly) at higher frequencies. Where a copy of the transmitted signal is provided to the bank of filters, it would be desirable for the collective response characteristics of the filters to correspond, at least substantially, to the spectrum of the transmitted signal, to improve the signal-to-noise ratio, and for other reasons. Where the transmitted signal is derived by summing the outputs of the filters, it would be desirable for the collective response characteristics of the filters to match the desired spectrum so that the transmitted signal is of a suitable form;

it is difficult to construct a filter with a rectangular power transfer function $|H(f)|^2$.

Therefore, it is of interest to examine the relationship between the number of degrees of freedom and the number of zero-crossings observed in a wideband random signal x(t) with its power spectral density $S_x(f)$ shaped suitably for ranging purposes. A brief analysis is presented in the example below.

EXAMPLE 2

Assume that a wideband zero-mean random signal x(t) employed to interrogate a surveillance region has a Gaussian distribution and that the power spectral density $S_x(f)$ of x(t) has a Gaussian shape $$S_x(f) = \exp\left(-\frac{f^2}{2B_x^2}\right) \qquad 2$$

where $B_x$ is the root-mean-square (rms) bandwidth of the random signal x(t). For a signal with a Gaussian spectrum, the commonly used 3 dB-bandwidth $B_{3dB}$ can be determined from the rms bandwidth $B_x$ as follows $$B_{3dB} = B_x\sqrt{2\ln 2} \approx 1.177 B_x \qquad 3$$

From Rice's formula it follows that, on average, $N_0(T) = 2B_x T$ zero-crossings can be extracted from the random signal x(t) during a time interval T.

Let a received signal y(t) contain a signal n(t) representing unwanted noise and other interference to be suppressed in the receiver; the power spectral density $S_n(f)$ of n(t) will have the same Gaussian shape as that of the interrogating random signal x(t). The number of degrees of freedom $\Lambda$, hence the maximum achievable processing gain, can be determined from $$\Lambda = \frac{T}{\int_{-\infty}^{\infty} R_n^2(\tau)\, d\tau} \qquad 4$$

where $R_n(\tau)$ is the normalised autocorrelation function of n(t), i.e., $R_n(0)=1$. Consequently, the maximum achievable processing gain is $$\Lambda = 2\sqrt{\pi}\, B_x T = \sqrt{\frac{2\pi}{\ln 2}}\, B_{3dB} T \qquad 5$$

Hence, $\Lambda > N_0(T) = 2B_x T$. Because each zero-crossing determines exactly one segment of a received signal y(t) to be averaged, the maximum processing gain cannot be attained.

In fact, because $N_0(T) \approx 0.56\Lambda$, the sampling scheme based on zero-crossings determines only about 56% of segments required for optimum interference suppression via averaging. Hence, the use of an interrogating random signal x(t) in conjunction with a basic crosslation method will result in a detection performance which is less than optimum.

In order to facilitate the understanding of the operational principles of a bank of filters constructed in accordance with a preferred embodiment of the invention, it is convenient (although not necessary) to assume first that the spectral density $S_x(f)$ of a primary random signal x(t) to be decomposed has a Gaussian shape, as discussed in Example 2 above.

To make the number of degrees of freedom equal to the number of zero-crossings observed in a first component random signal $x_1(t)$, the required power spectral density $S_{x1}(f)$ of $x_1(t)$ can be obtained by forming a difference between the primary density $S_x(f)$ of x(t) and its frequency-scaled version $S_{x\alpha}(f)$, where $$S_{x\alpha}(f) = \exp\left(-\frac{f^2}{2\alpha^2 B_x^2}\right) \qquad 6$$

and $\alpha \approx 0.325$ (the derivation of the value $\alpha$ is set out below).

$$S_{x1}(f) = \exp\left(-\frac{f^2}{2B_x^2}\right) - \exp\left(-\frac{f^2}{2\alpha^2 B_x^2}\right) \qquad 7$$

In this case, the ratio of the bandwidth of the primary Gaussian spectral density $S_x(f)$ to that of the Gaussian density $S_{x\alpha}(f)$ is equal to $1/\alpha \approx 3.08$. It should be noted that in the considered Example 1 of rectangular frequency spectra, a similar ratio was equal approximately to 3.19.

For a Gaussian spectral density in the frequency band ($W_1$, $W_2$), the number M of required filters will be:

TABLE 2

| $R_{UL}$ | M |
|---|---|
| $R_{UL} \leq 3.08$ | 1 |
| $3.08 < R_{UL} \leq 9.47$ | 2 |
| $9.47 < R_{UL} \leq 29.13$ | 3 | where, again, $R_{UL} = W_2/W_1$.

Figure 8:
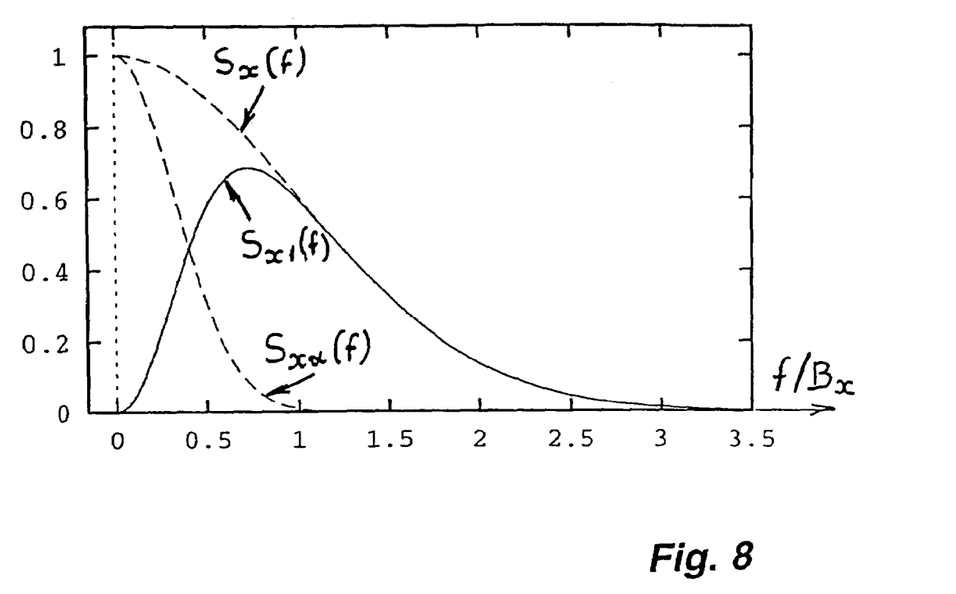
FIG. 8 depicts the required power spectral density (solid line) obtained by subtracting the frequency-scaled Gaussian spectrum from the primary Gaussian spectrum (broken lines).

FIG. 8 depicts the required power spectral density $S_{x1}(f)$ (shown in solid line) obtained by subtracting the frequency-scaled Gaussian spectrum $S_{x\alpha}(f)$ from the primary Gaussian spectrum $S_x(f)$ (both shown in broken lines).

Figure 9:
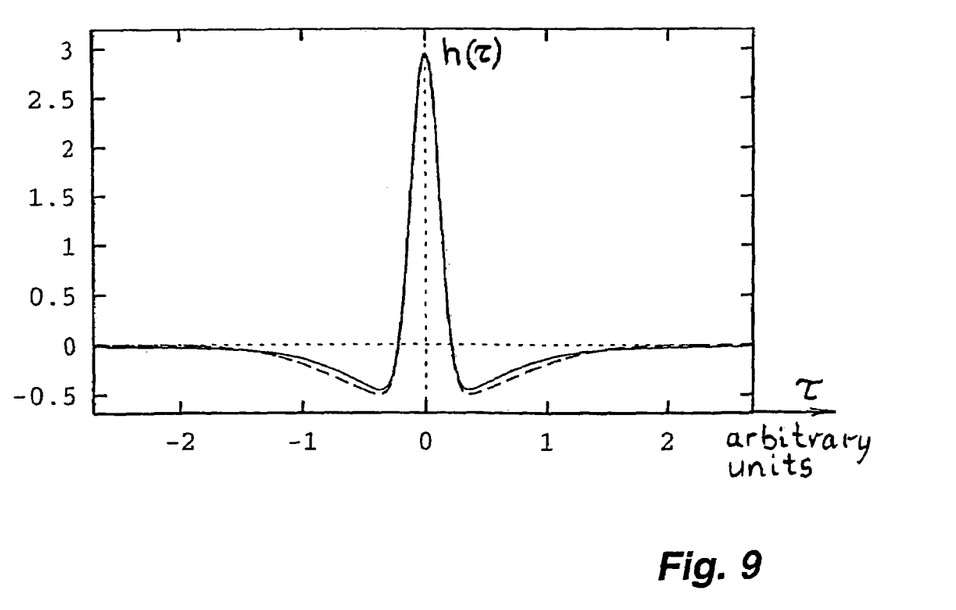
FIG. 9 shows the required impulse response (solid line) and its approximation (broken line).

In principle, a component random signal $x_1(t)$ with the required spectrum $S_{x1}(f)$ may be obtained by passing a wideband random signal through a bandpass filter with the following transfer function $$H_1(f) = \sqrt{S_{x1}(f)} \exp[-j\theta(f)] \qquad 8$$

where $\theta(f)$ is an arbitrary realizable phase characteristic. In the case of a linear phase characteristic (or when $\theta(f)=0$), the impulse response $h_1(\tau)$ of the filter F1 will assume the form shown in solid line in FIG. 9. However, a filter specified by the required transfer function $H_1(f)$ or, equivalently, by the impulse response $h_1(\tau)$, may be difficult to implement in practice.

In accordance with a further preferred aspect of the invention, a primary wideband random signal x(t) with a suitable shape (not necessarily Gaussian) of its spectrum $S_x(f)$ is decomposed into a plurality of component random signals with the use of a filter bank comprising only low-pass filters with substantially constant group delays and overlapping transfer functions.

Figures 10, 11:
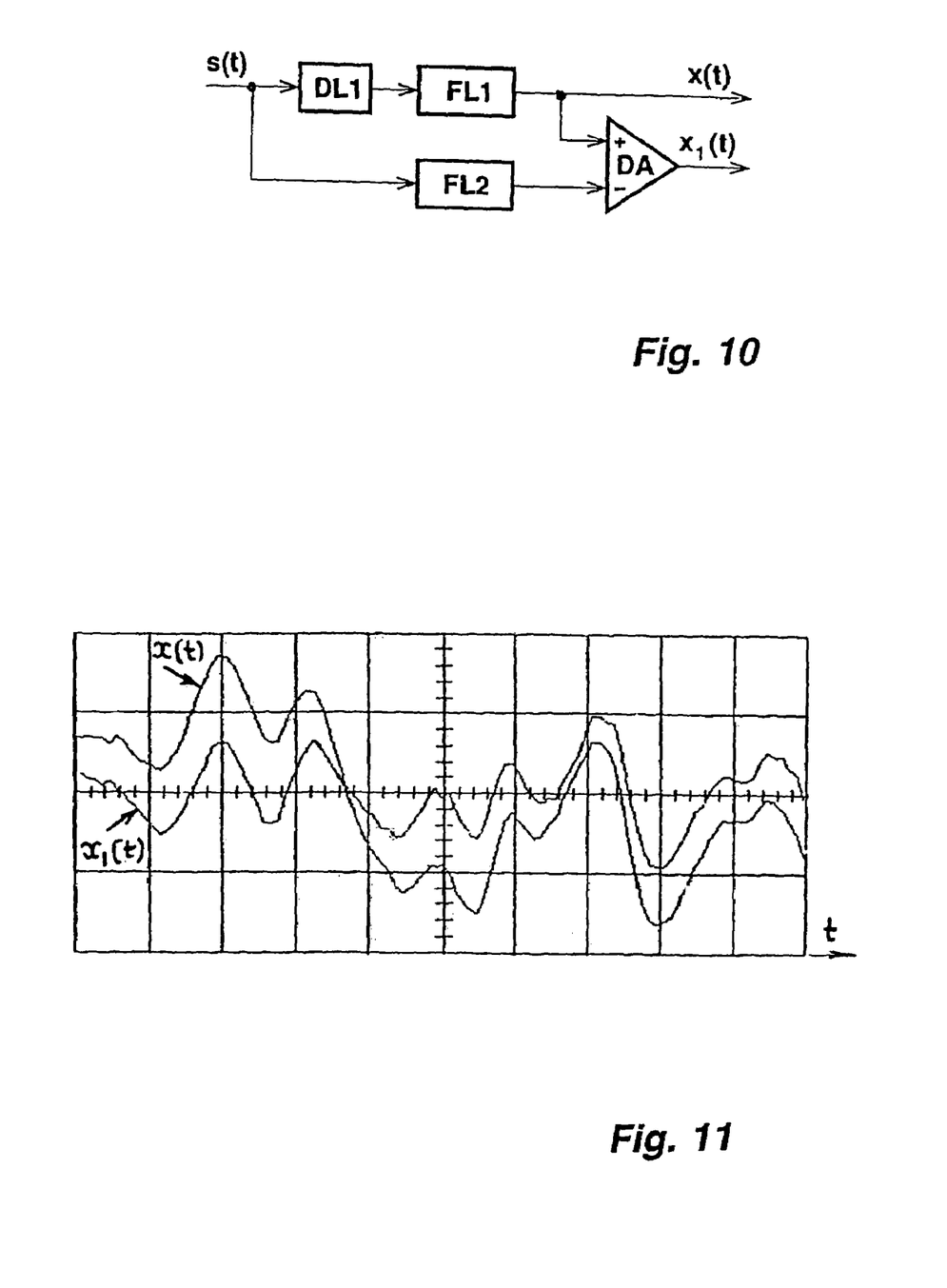
FIG. 10 is a block diagram of a basic bandpass cell of a bank of filters, arranged to operate in accordance with the invention.
FIG. 11 shows examples of a primary wideband random signal and a resulting bandpass component random signal obtained experimentally by applying a wideband noise signal to the basic bandpass cell, constructed in accordance with the invention.

FIG. 10 depicts a block diagram of a basic bandpass cell of a bank of filters arranged to operate in accordance with the present invention. The cell comprises two low-pass filters FL1 and FL2, each with a suitably chosen bandwidth (that of filter FL1 being greater than that of FL2) and a substantially constant group delay, a constant delay DL1, and a wideband differential amplifier DA.

The two low-pass filters, FL1 and FL2, may be of commercially available types (such as Bessel, Bessel-Thomson, or quasi-Gaussian) used for data transmission applications, e.g., in SONET (Synchronous Optical NETwork) or SDH (Synchronous Digital Hierarchy) systems. In general, a filter FL2 with a narrower bandwidth will have a greater group delay than that of a filter FL1 with a broader bandwidth. Therefore, the delays experienced by an input signal s(t) in the two channels can be made equal by incorporating a suitably chosen delay DL1 into a channel containing the filter FL1. The value of this delay is equal to the difference in the respective group delays. Consequently, the resulting impulse response, shown in broken line in FIG. 9, can approximate the required impulse response, shown in solid line.

FIG. 11 shows examples of a primary wideband random signal x(t) and a resulting bandpass component random signal $x_1(t)$ obtained experimentally by applying a wideband noise signal s(t) to the basic bandpass cell of FIG. 10. The cell comprises two low-pass filters with substantially constant group delays and the 3-dB bandwidths of 117 MHz and 39 MHz, respectively. The value of the auxiliary constant delay DL1 was equal to 5 ns. As seen, the resulting bandpass component signal $x_1(t)$ exhibits more zero-crossings than does the primary wideband signal x(t).

For any types of low-pass filters, FL1 and FL2, with constant group delays, the following procedure can be used to determine the required bandwidth of the filter FL2 and to select the required delay of DL1:

1. for a selected filter FL1, use its frequency characteristic, provided by the manufacturer, to determine numerically the number of degrees of freedom $\Lambda_1$ (in time T) associated with that characteristic (e.g., by applying the method described in Example 2);
2. determine experimentally the group delay of FL1 (e.g., by examining its response to a unit step function);
3. select a filter FL2 (not necessarily of the same type as FL1) with a 3 dB-bandwidth equal approximately to ⅓ of that of FL1;
4. determine numerically the number of degrees of freedom $\Lambda_2$ (in time T), for the filter FL2;
5. determine experimentally the group delay of FL2 and calculate the required delay value of DL1 from the difference in the group delays of FL1 and FL2;
6. determine experimentally the number $N_{0\times1}(T)$ of zero-crossings observed in time T in the resulting bandpass component signal $x_1(t)$;
7. if $N_{x1}(T) \sim (\Lambda_1 - \Lambda_2)$, terminate the procedure;
8. if $N_{0\times1}(T) > (\Lambda_1 - \Lambda_2)$, decrease the bandwidth of FL2, and if $N_{0\times1}(T) < (\Lambda_1 - \Lambda_2)$, increase the bandwidth of FL2 (by altering the characteristics of FL2 or choosing a different filter to use as FL2);
9. go to step 4.

When filter FL2 is of the same type as filter FL1, Step 4 will exploit the relationship, already established in Step 1, between the bandwidth and the number of degrees of freedom to determine the value of $\Lambda_2$. This relationship will also be used when Step 4 is repeated to find new values of $\Lambda_2$.

When filter FL2 is not of the same type as filter FL1, Step 4 will establish the required relationship between the bandwidth and the number of degrees of freedom for the type of selected filter FL2; the value of $\Lambda_2$ will then be determined. When Step 4 is repeated, the same relationship will be used to determine new values of $\Lambda_2$.

The above procedure, in a suitably modified form, can also be used to determine the required parameters of the basic bandpass cell by computer analyses and simulations. In such a case, Steps 2 and 5 are omitted, and the number of zero-crossings to be determined in Step 6 can be obtained numerically from the value of the rms bandwidth of the resulting spectrum.

Such techniques for designing a bank of filters, and means (such as a computer program) employing such techniques, are regarded as being independently inventive.

Figure 12:
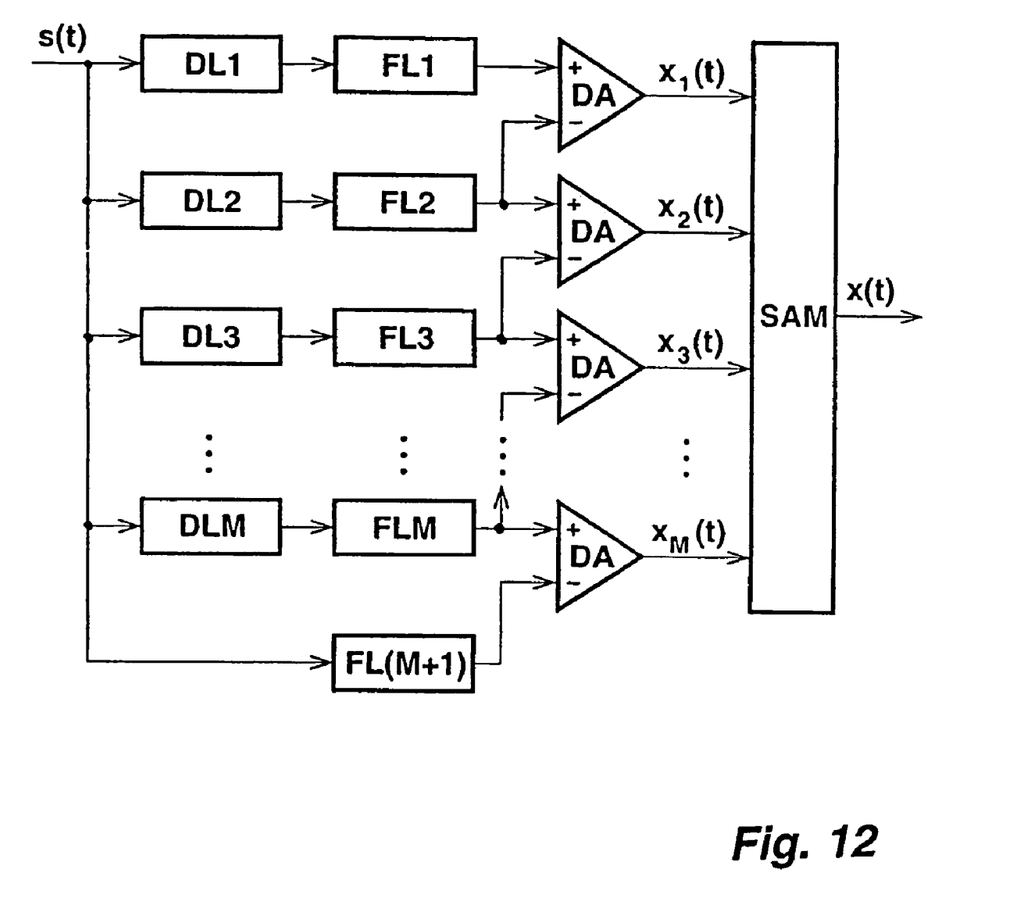
FIG. 12 depicts a block diagram of a bank of filters comprising a plurality of basic bandpass cells, arranged to operate in accordance with the present invention.

FIG. 12 depicts a block diagram of a bank of filters BOF comprising a plurality of basic bandpass cells, arranged to operate in accordance with the present invention. The system has an iterated structure comprising (M+1) low-pass filters, FL1, FL2, ..., FL(M+1), with suitably chosen bandwidth, M constant delays, DL1, DL2, ... DLM, M identical differential amplifiers DA, and a summing amplifier SAM. The value of the constant delay DLm preceding each low-pass filter FLm, except for filter FL(M+1), is so selected as to obtain the maxima of the impulse responses of all the resulting (M+1) channels to coincide at the same time instant. In the application shown, the bank of filters is driven by a wideband signal s(t), and a primary wideband signal x(t) with a required bandpass spectrum is obtained by summing the component signals, $x_1(t), x_2(t), \ldots, x_M(t)$ in a suitable summing amplifier SAM, after which the signal x(t) is transmitted as an interrogation signal.

As mentioned above, the component signals could be transmitted by multiple antennas, in which case the block SAM would represent the antennas, the signal x(t) being created by the simultaneous transmission of the respective components. Alternatively, some components could be summed together to form component sets which are then transmitted by separate antennas.

Figure 13:
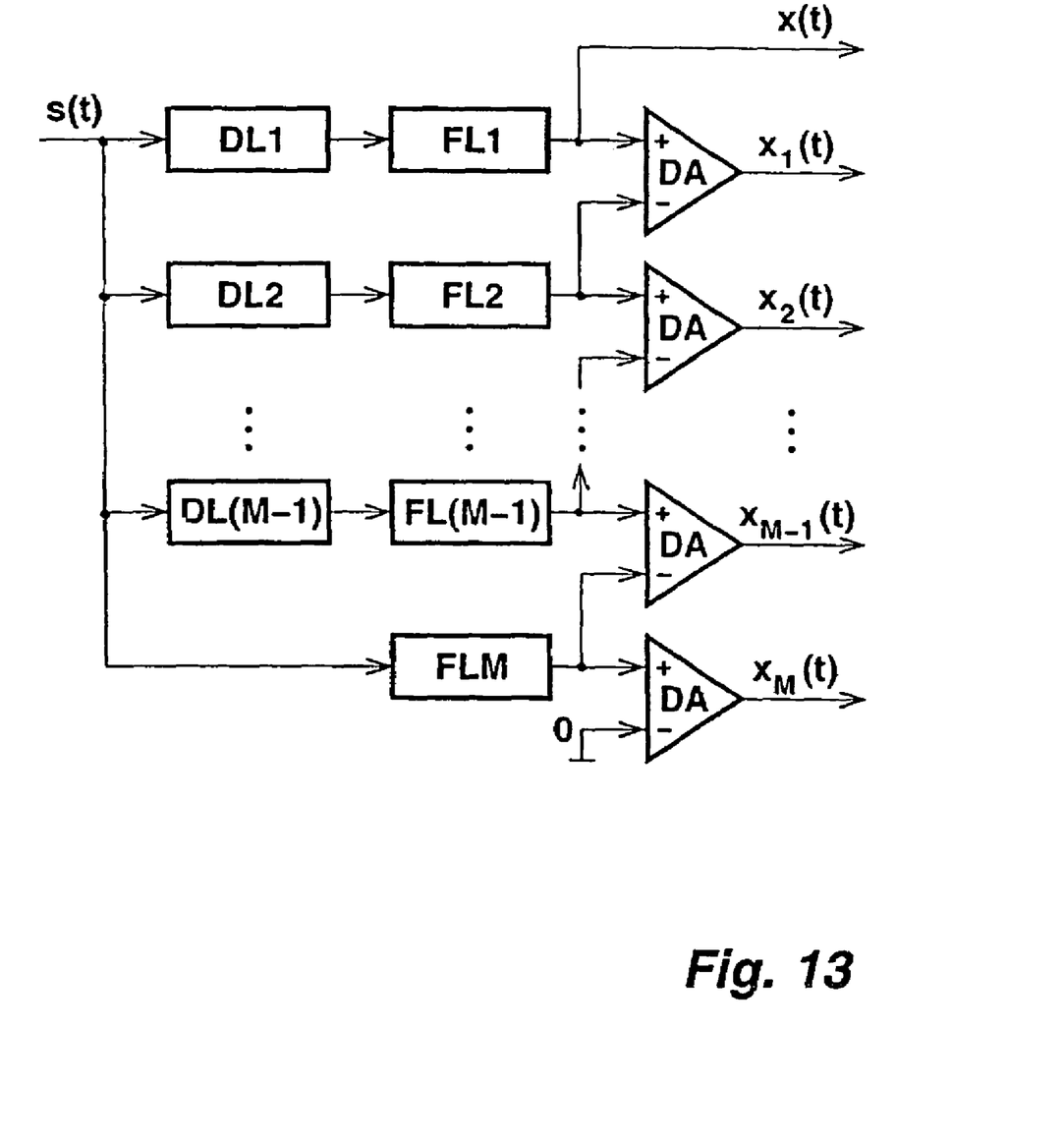
FIG. 13 depicts a block diagram of a modified bank of filters comprising a plurality of basic bandpass cells and a single low pass filter, arranged to operate in accordance with the present invention.

FIG. 13 depicts a block diagram of a modified bank of filters comprising a plurality of basic bandpass cells, arranged to operate in accordance with the present invention. In this application, the bank of filters is also driven by a wideband signal s(t), but the primary wideband signal x(t) with a required low-pass spectrum is obtained at the output of a low-pass filter FL1 used in channel 1. It should be noted that, by design, the sum of the component signals, $x_1(t), x_2(t), \ldots, x_M(t)$, forms a replica of the signal x(t), delayed by the value introduced by the differential amplifier DA. The system configuration differs from that shown in FIG. 12 as follows:

no summing amplifier is needed;
only M low-pass filters are used;
only (M−1) constant delays are required.

Either of the two banks of filters described above can be exploited to construct a suitable binary component resolver BCRX to be utilized in conjunction with the underlying bank of filters BOFY in an improved crosslator XL, employed by the object detecting system shown in FIG. 6 or FIG. 7.

The invention is also applicable to the type of time delay determining system shown in FIG. 2. Also, the different frequency bands could be processed in succession, rather than simultaneously, in order to reduce the number of required components.

Figure 14:
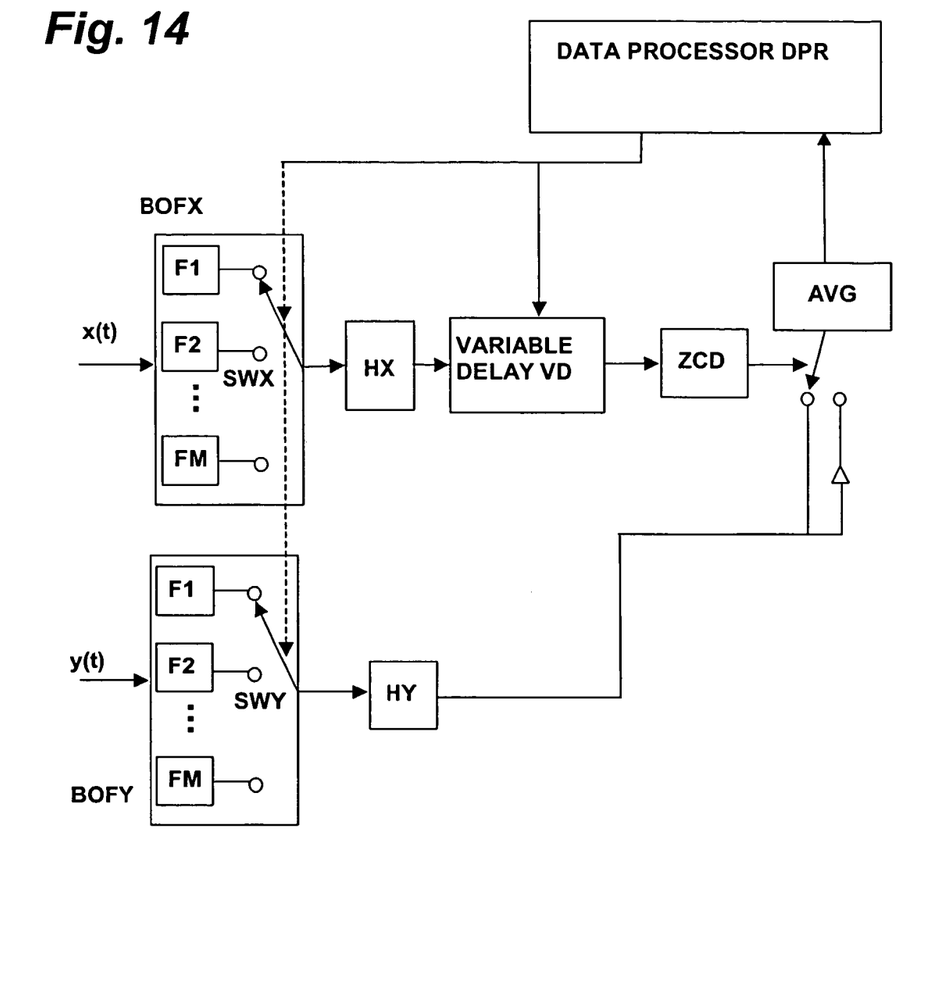
FIG. 14 is a block diagram of a further time delay determining system according to the present invention.

FIG. 14 shows an embodiment using such techniques. References corresponding to those in FIG. 2 relate to like components.

The signal x(t) is delivered to a bank of filters BOFX incorporating a switch SWX which selects the output of any one of the filters F1, F2, ..., FM. Similarly, the signal y(t) is delivered to a bank of filters BOFY, incorporating a switch SWY for selecting the output of one of the filters. A data processor DPR operates the two switches SWX and SWY simultaneously so that corresponding filters are selected. The output of the switch SWX is delivered via a hard limiter HX to a variable delay circuit VD, controlled by the data processor DPR, and then to a zero-crossing detector ZCD. The output of the switch SWY is delivered to a hard limiter HY. As in FIG. 2, the zero-crossing detector ZCD causes the output of the hard limiter HY to be delivered to an averager or integrating unit AVG whenever an upcrossing is detected in the signal x(t), and causes an inverted version of the output of hard limiter HY to be delivered to the averager AVG whenever a downcrossing is detected.

In operation, the data processor DPR sets the switches SWX and SWY to select the first filter F1 of the two banks BOFX and BOFY. The system operates for a predetermined period, or until a predetermined condition is met, during which the averager AVG accumulates a value which is dependent upon the value of signal y(t) at the instants at which the zero-crossings detector ZCD detects upcrossings and downcrossings. The data processor DPR then operates the switches SWX and SWY to select the next filter F2, whereupon the operation is repeated, thus combining (possibly in a weighted manner) the outputs obtained from the respective frequency bands. This continues until all filters have been selected in turn. Then, the data processor DPR reads the output of the averager AVG, resets the averager, changes the delay caused by the variable delay VD and repeats the procedure.

Accordingly, the data processor DPR will obtain from the averager AVG one value for each setting of the variable delay VD, and is then able to select the delay value which brings the signal x(t) into substantial coincidence with the signal y(t). For each delay value, the averager is influenced in succession by the components of the signals x(t) and y(t) in the respective frequency bands of the filters F1, F2, . . . FM.

In the crosslation techniques mentioned above, significant events in one signal are used to sample another signal and the samples are combined. This is repeated while introducing different delays between the respective signals. For each delay, a value is obtained, and these values are analysed to determine which represents the greatest coincidence between the significant events in the first signal and corresponding parts of the second signal. It is additionally possible to use significant events in the second signal in order to sample the first signal. If the value for each delay is obtained by combining the samples from the first signal with the samples from the second signal, a better signal-to-noise ratio is obtained.

Although the decomposition techniques of the present invention have been described in the context of object detection systems using crosslation, other applications also exist. The techniques are of particular value for facilitating analysis of signals, for example by deriving therefrom significant events such as zero-crossings, and for comparing two signals, one of which may be a time-delayed version of the other. In the latter case, it is not essential that crosslation techniques be used; instead other techniques, known per se, could be employed, e.g. correlation, such as polarity-coincidence correlation.

The techniques of the invention may also be used for other types of analysis of a wideband irregular signal. For example, as mentioned above, WO-A-03/036564 describes a technique for classifying a signal (which may represent an entity such as an image) by analysing the characteristics of the signal with reference to one or more thresholds. Using the techniques of the present invention, the original signal can be separated into respective different components occupying different frequency bands, as a result of which the combined number of times the respective components cross a given threshold is substantially increased in comparison with the original signal. The invention could be exploited by using the techniques to reduce the number of different thresholds taken into consideration (possibly using only one level threshold which may be zero if the signal is bipolar), and/or deriving a feature vector which has separate components corresponding to the separate frequency bands.

Some systems benefit from the detection of crossings of a level set at the mid-range of the signal (especially zero-crossings in bipolar signals), because the results are independent of scale and therefore less influenced by, for example, signal strength. This benefit would be lost if, in order to improve performance, non-zero level crossings were to be additionally used. The invention is of particular advantage in such systems because it generates additional zero-crossings, so performance is improved without requiring the use of non-zero level-crossings.

The invention is particularly suited to systems (such as described above) which detect both upcrossings and downcrossings, but which distinguish between these so that they can be processed differently.

The invention is of particular value when applied to chaotic random signals. However, the invention can also be applied to other signals, such as noise-like signals, or deterministic signals (which are preferably at least substantially aperiodic during time periods of interest), and the term "random" is intended to encompass such irregular signals.

The foregoing description of preferred embodiments of the invention has been presented for the purpose of illustration and description. It is not intended to be exhaustive or to limit the invention to the precise form disclosed. In light of the foregoing description, it is evident that many alterations, modifications, and variations will enable those skilled in the art to utilize the invention in various embodiments suited to the particular use contemplated.

The derivation of a suitable value of $\alpha$ (see formula 6) representing the frequency scaling is as follows.

Let x(t) be a stationary zero-mean random Gaussian signal with the power spectral density (psd) $S_x(f)$ of the Gaussian form $$S_x(f) = \exp\left(-\frac{f^2}{2B_x^2}\right) \quad \text{(A)}$$

where $B_x$ is the root-mean-square (rms) bandwidth defined by $$B_x \triangleq \sqrt{\frac{\int_{-\infty}^{\infty} f^2 S_x(f) df}{\int_{-\infty}^{\infty} S_x(f) df}} \quad \text{(B)}$$

In the case of a random Gaussian signal x(t), the number $N_0(T)$ of all zero-crossings (i.e. upcrossings and downcrossings) occurring in a time interval T is given by Rice's formula $$N_0(T) = 2B_x T \quad \text{(C)}$$

where $B_x$ is the rms bandwidth of the signal.

The number of degrees of freedom $\Lambda$, characterizing a segment of a random Gaussian signal x(t), can be determined from $$\Lambda = \frac{T}{\int_{-\infty}^{\infty} R_x^2(\tau) d\tau} \quad \text{(D)}$$

where T is the duration of the segment, and $R_x(\tau)$ is the normalised autocorrelation function of x(t), i.e. $R_x(0)=1$.

The normalised autocorrelation function $R_x(\tau)$ of a signal x(t) with the psd (A) is of the form $$R_x(\tau) = \exp(-2\pi^2 B_x^2 \tau^2) \quad \text{(E)}$$

Therefore, the number of degrees of freedom $\Lambda$ contained in a segment T of x(t) is given by $$\Lambda = 2\sqrt{\pi} B_x T \quad \text{(F)}$$

As seen from (C) and (F), because $N_0(T) < \Lambda$, zero-crossings of a random Gaussian signal x(t) with the psd (A), observed over interval T, cannot possibly fully represent that signal segment.

Consider a random Gaussian signal $x_1(t)$ with the following psd $$S_{x1}(f) = S_x(f) - S_{x\alpha}(f) \quad \text{(G)}$$

where $$S_{x\alpha} = \exp\left[-\frac{f^2}{2(\alpha B_x)^2}\right] \quad 0 < \alpha < 1 \quad \text{(H)}$$

This specific form of (G) has been obtained by subtracting from (A) its frequency-scaled version (H). Consequently, the resulting psd (G) has a distinct bandpass characteristic. The shapes of the above psds are shown in FIG. 8.

Since both the spectral components of (G) have Gaussian shapes, the number of degrees of freedom $\Lambda_1$ associated with a segment T of a signal $x_1(t)$ with the psd (G) can be expressed as $$\Lambda_1 = 2\sqrt{\pi} B_x T(1-\alpha) \qquad (I)$$

The rms bandwidth $B_{x1}$ of $x_1(t)$ with the psd (G) can be determined from (B); hence $$B_{x1} = B_x \sqrt{1+\alpha+\alpha^2} \qquad (J)$$

Consequently, the number $N_{01}$ of zero-crossings occurring in a segment T of $x_1(t)$ is given by $$N_{01}(T) = 2B_x T \sqrt{1+\alpha+\alpha^2} \qquad (K)$$

As seen from (I) and (K), the ratio $$\frac{N_{01}(T)}{\Lambda_1} = \frac{\sqrt{1+\alpha+\alpha^2}}{\sqrt{\pi}(1-\alpha)} \qquad (L)$$

increases from $1/\sqrt{\pi}$, for $\alpha=0$, to infinity for $\alpha$ approaching one.

When $N_{01}(T) > \Lambda_1$, a signal is said to be overdetermined by its zero-crossings; similarly, when $N_{01}(T) < \Lambda_1$, a signal is underdetermined by its zero-crossings. Therefore, it is of both theoretical and practical interest to calculate this specific value $\alpha^*$ of a $\alpha$ for which $N_{01}(T) = \Lambda_1$.

The value $\alpha^*$ is a solution to the equation $$\alpha^2 - \alpha\left(\frac{2\pi+1}{\pi-1}\right) + 1 = 0 \qquad (M)$$

which satisfies the condition $0 < \alpha^* < 1$; hence $$\alpha^* = \frac{2\pi+1}{2(\pi-1)} - \sqrt{\left[\frac{2\pi+1}{2(\pi-1)}\right]^2 - 1} \qquad (N)$$

and $\alpha^* \sim 0.325$.

Therefore, a random Gaussian signal $x_1(t)$ with the following bandpass psd $$S_{x1}(f) = S_x(f) \cdot \exp\left[-\frac{f^2}{2(\alpha * B_x)^2}\right] \qquad (O)$$

will have a necessary number of zero-crossings for its representation in the sense that, for any specified time interval T, the number of zero-crossings observed in T will be equal to the number of degrees of freedom associated with that interval.

This analysis is applicable to a random signal with a Gaussian probability density function and a Gaussian power spectral density (psd), and can be modified to include a random Gaussian signal with a psd having a shape different from a Gaussian form. It is believed that the value $\alpha$(0.3139 for uniform psd and 0.325 for Gaussian psd) is unlikely to be significantly different for other types of signals of practical interest, and consequently a high/low frequency ratio of approximately 3:1 is likely to produce efficient results for all such signals.

The invention claimed is:

1. An apparatus for analyzing a wideband irregular signal, the apparatus comprising:
    means for separating the signal into components occupying different frequency bands which are substantially contiguous, and;
    means for, within each frequency band, detecting level-crossings in the respective components;
    wherein the ratio of the highest frequency of each frequency band to the highest frequency of the next-lower band is from 2.5:1 to 3.5:1.

2. An apparatus as claimed in claim 1 or claim 3, wherein said ratio is greater than or equal to 3.0:1.

3. An apparatus for analysing a wideband irregular signal, the apparatus comprising:
    means for separating the signal into components occupying N different frequency bands which do not substantially overlap, which have substantially the same relative bandwidth and which collectively substantially encompass a bandwidth wherein the ratio of the highest frequency to that of the lowest frequency is at least 2.5 to the power of N, and;
    means for, within each frequency band, detecting level-crossings in the respective components.

4. An apparatus as claimed in claim 3, wherein N is less than 5.

5. An apparatus as claimed in claim 1 or claim 3, wherein the means for detecting level-crossings is arranged to detect zero-crossings.

6. An apparatus as claimed in claim 1 or claim 3, the apparatus further comprising:
    a plurality of channels each for receiving the wideband irregular signal and each operable to introduce a delay to the signal, to low-pass filter the signal and to provide a channel output which subtracts from the low-pass delayed signal the corresponding signal from the channel with the next lower filter cut-off frequency characteristic, the delay circuit characteristics in the respective channels being such that the delay and low-pass filtering effectively provide substantially the same total delay in each channel.

7. An apparatus for decomposing and representing a wideband signal, the apparatus comprising:
    an apparatus as claimed in claim 1 or claim 3 for decomposing the signal; and
    means for combining the signal components in order to provide a representation of the wideband signal.

8. An apparatus for determining the shift between two wideband irregular signals, the apparatus comprising:
    an analysing apparatus as claimed in claim 1 or claim 3 for detecting level-crossings in respective components of a first signal;
    means for sampling respective components of a second signal at times determined by the level-crossings detected in a corresponding first signal component and a predetermined delay;
    means for combining the samples obtained in step (b) for all said frequency bands to obtain a value associated with the predetermined delay;
    means for repeating steps (b) and (c) for different predetermined delays to obtain multiple values each associated with a respective delay; and means for analysing said values to determine the delay corresponding to the shift between the first and second signals.

9. An object detection apparatus comprising:
an apparatus as claimed in claim 8 for measuring the shift between a transmitted signal and its reflection; and
means for deriving from the shift an indication of the distance of an object from which the transmitted signal is reflected.

10. An object detection apparatus as claimed in claim 9, including means for deriving the transmitted signal by combining the components of the first signal.

11. An object detection apparatus as claimed in claim 9, comprising means for separately transmitting the components of the transmitted signal in respective channels.

12. An object detection apparatus as claimed in claim 11, comprising multiple antennas to transmit the respective components.

13. An object detection apparatus comprising:
an apparatus as claimed 7;
means for transmitting the representation, means for detecting and decomposing the reflection of the transmitting representation; and
means for detecting an object by combining each said signal component with a respective decomposed component of the detected reflection.

14. An object detection apparatus as claimed in claim 9, further comprising:
multiple antennas arranged to receive components of the reflected signal occupying respective frequency ranges.

15. A method of producing the separating means of an analyzing apparatus as claimed in claim 1 or claim 3, the method comprising:
for a first filter in a first channel, determining the number of degrees of freedom, in a predetermined time, associated with the frequency characteristic of the first filter;
determining the group delay of the first filter;
selecting a second filter for a second channel, the second channel having the next lower filter cut-off frequency characteristic as compared with the first channel, and the second filter having a bandwidth substantially smaller than that of the first filter;
determining the number of degrees of freedom, in a predetermined time, associated with the frequency characteristic of the second filter;
determining the group delay of the second filter and calculating a required delay value for the second channel from the difference in the group delays of the first and second filters;
determining the number of zero-crossings, in a predetermined time, observed in the bandpass component signal output from the first filter; and
adjusting the bandwidth of the second filter, or replacing the second filter with a filter of different bandwidth, until the determined number of zero-crossings is substantially equal to the difference between the determined numbers of degrees of freedom.

16. An object detection apparatus as claimed in claim 13, further comprising:
multiple antennas arranged to receive components of the reflected signal occupying respective frequency ranges.

* * * * *